United States Patent
Mochizuki

(10) Patent No.: US 11,561,240 B2
(45) Date of Patent: Jan. 24, 2023

(54) INTERMEDIATE CONNECTING MEMBER AND INSPECTION APPARATUS

(71) Applicant: Tokyo Electron Limited, Tokyo (JP)

(72) Inventor: Jun Mochizuki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/305,748

(22) Filed: Jul. 14, 2021

(65) Prior Publication Data

US 2021/0341515 A1 Nov. 4, 2021

Related U.S. Application Data

(62) Division of application No. 15/930,617, filed on May 13, 2020, now abandoned.

(30) Foreign Application Priority Data

May 27, 2019 (JP) ................... 2019-098861

(51) Int. Cl.
*G01R 1/04* (2006.01)
*G01R 31/28* (2006.01)

(52) U.S. Cl.
CPC ....... *G01R 1/0491* (2013.01); *G01R 31/2889* (2013.01); *G01R 31/2891* (2013.01)

(58) Field of Classification Search
CPC .............. G01R 1/0491; G01R 31/2889; G01R 31/2891
See application file for complete search history.

(56) References Cited

U.S. PATENT DOCUMENTS

| | | | |
|---|---|---|---|
| 4,978,914 A | 12/1990 | Akimoto et al. | |
| 5,175,214 A | 12/1992 | Takaya et al. | |
| 5,975,922 A | 11/1999 | Jin | |
| 7,082,676 B2* | 8/2006 | Ramirez ............ | H01R 13/6485 324/750.25 |
| 7,452,212 B2 | 11/2008 | Hougham et al. | |
| 7,832,095 B2 | 11/2010 | Hougham et al. | |
| 2002/0127893 A1 | 9/2002 | Brodsky | |
| 2006/0000294 A1 | 1/2006 | Ohta | |
| 2007/0178727 A1 | 8/2007 | Igarashi et al. | |
| 2007/0210811 A1* | 9/2007 | Cojocneanu ....... | G01R 31/2887 324/750.16 |

FOREIGN PATENT DOCUMENTS

| | | |
|---|---|---|
| EP | 0210002 | 1/1987 |
| JP | 2016-046285 | 4/2016 |

* cited by examiner

*Primary Examiner* — Paresh Patel
(74) *Attorney, Agent, or Firm* — IPUSA, PLLC

(57) ABSTRACT

An intermediate connecting member according to one aspect of the present disclosure is provided between a first member including multiple first terminals and a second member including multiple second terminals. The intermediate connecting member includes multiple connection parts configured to electrically connect the first terminals to the second terminals, and a retainer holding the multiple connection parts. Each of the multiple connection parts is formed of an elastic member to which an electrically conductive property is given at least on a surface of the elastic member.

4 Claims, 6 Drawing Sheets

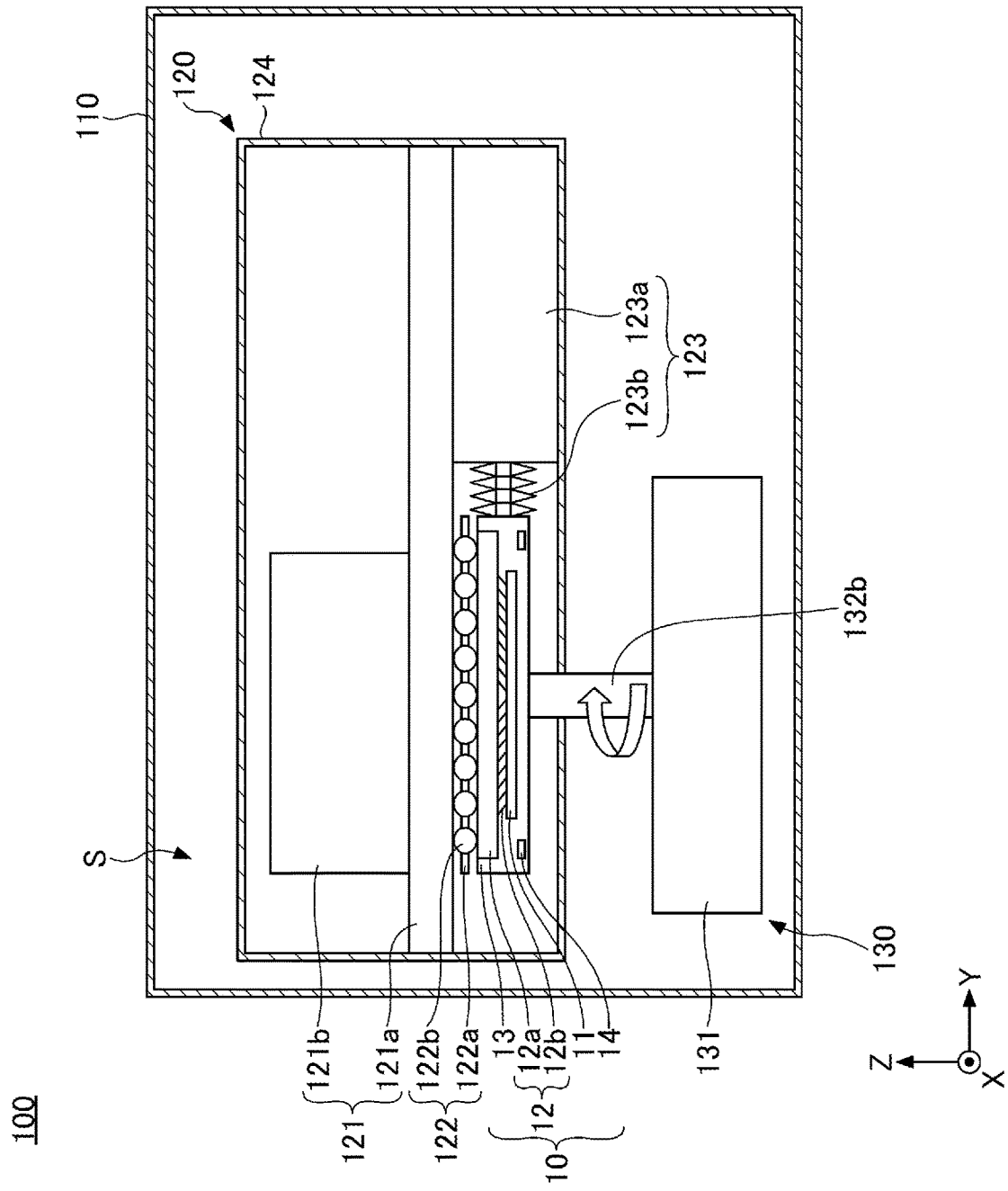

INTERMEDIATE CONNECTING MEMBER AND INSPECTION APPARATUS

CROSS-REFERENCE TO RELATED APPLICATIONS

This application is a divisional of U.S. patent application Ser. No. 15/930,617 filed on May 13, 2020, which is based on and claims priority to Japanese Patent Application No. 2019-098861 filed on May 27, 2019. The entire contents of these applications are incorporated herein by reference.

TECHNICAL FIELD

The present disclosure relates to an intermediate connecting member and an inspection apparatus.

BACKGROUND

There is known an inspection apparatus for performing inspection of a substrate. The inspection apparatus includes multiple inspection units, a shared transport robot or a mobile stage. In the inspection apparatus, while the transport robot or the mobile stage is loading a substrate to one of the inspection units, the other inspection units can perform inspection (see Patent Document 1 for example).

CITATION LIST

Patent Document

[Patent Document 1] Japanese Laid-open Patent Application Publication No. 2016-046285

SUMMARY

The present disclosure provides a technique for simplifying an interface.

An intermediate connecting member according to one aspect of the present disclosure is provided between a first member including multiple first terminals and a second member including multiple second terminals. The intermediate connecting member includes multiple connection parts configured to electrically connect the first terminals to the second terminals, and a retainer holding the multiple connection parts. Each of the multiple connection parts is formed of an elastic member to which an electrically conductive property is given on at least a surface of the elastic member.

BRIEF DESCRIPTION OF THE DRAWINGS

FIG. 2 is another cross-sectional view illustrating the example of the configuration of the inspection unit according to the first embodiment;

DETAILED DESCRIPTION OF EMBODIMENTS

Figure 1:
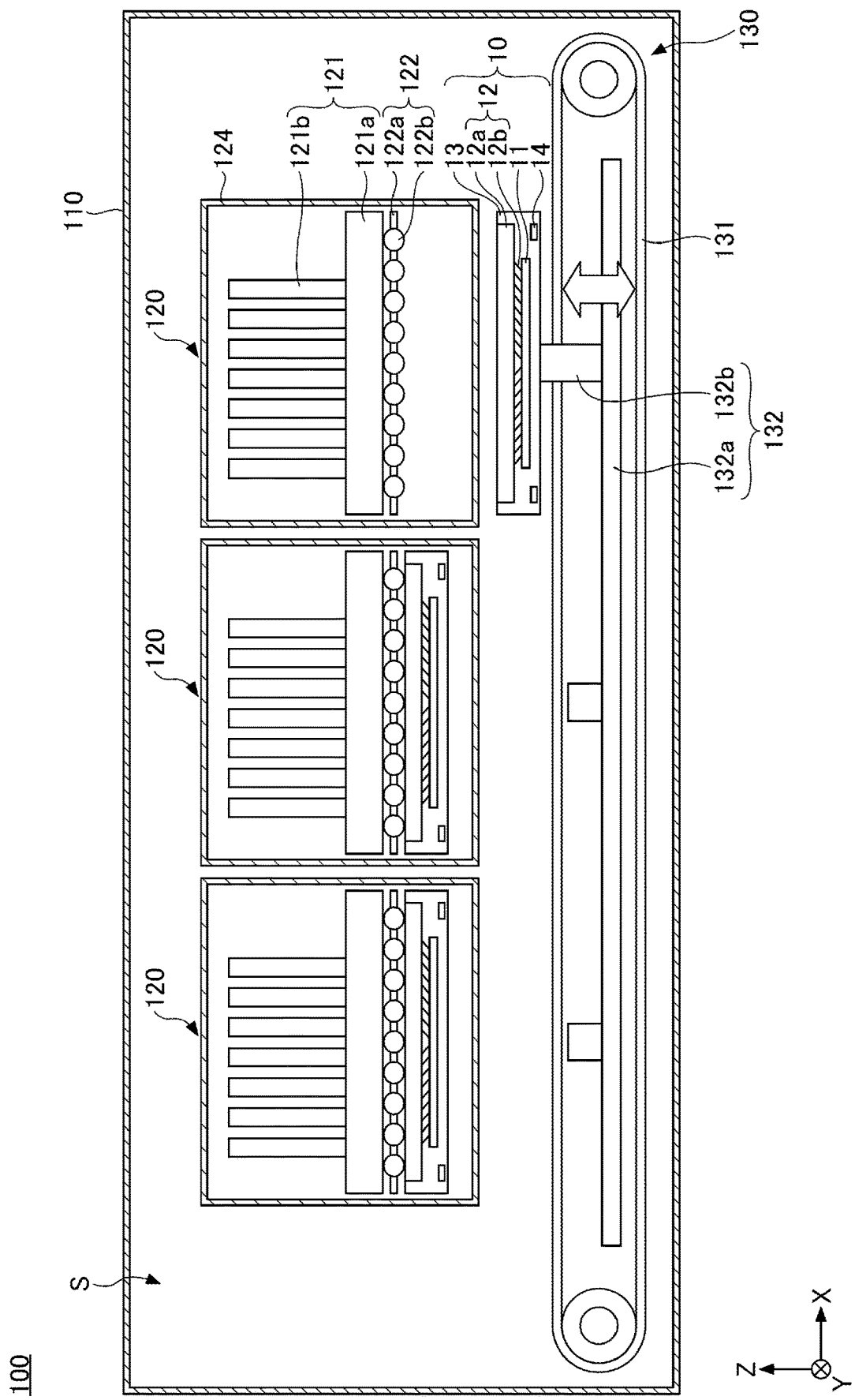
FIG. 1 is a cross-sectional view illustrating an example of the configuration of an inspection unit according to a first embodiment.

Hereinafter, a non-limiting embodiment of the present disclosure will be described with reference to the accompanying drawings. In all the accompanying drawings, the same or corresponding reference numerals shall be attached to the same or corresponding components and the description thereof may be omitted.

First Embodiment

An inspection unit according to a first embodiment will be described. The inspection unit is a unit that tests various electrical characteristics of multiple devices under test (DUTs) formed on an object to be inspected, by applying electrical signals to the DUTs. The object to be inspected is a substrate such as a semiconductor wafer (hereinafter referred to as a "wafer").

FIG. 1 is a cross-sectional view illustrating an example of the configuration of the inspection unit according to a first embodiment. FIG. 2 is another cross-sectional view illustrating the example of the configuration of the inspection unit according to the first embodiment.

As illustrated in FIGS. 1 and 2, the inspection unit 100 includes an inspection chamber 110, multiple inspection devices 120, and a transfer device 130.

A climate-controlled space S (e.g., controlling dew point by dry air) is formed within the inspection chamber 110. The inspection chamber 110 accommodates the multiple inspection devices 120 and the transfer device 130.

The multiple inspection devices 120 are arranged, for example, in one direction (in the X direction) in the same plane (in the XY plane). Each of the inspection devices 120 inspects electrical characteristics of each DUT formed on a wafer 11 in a shell 10 conveyed by the transfer device 130.

Figure 8:
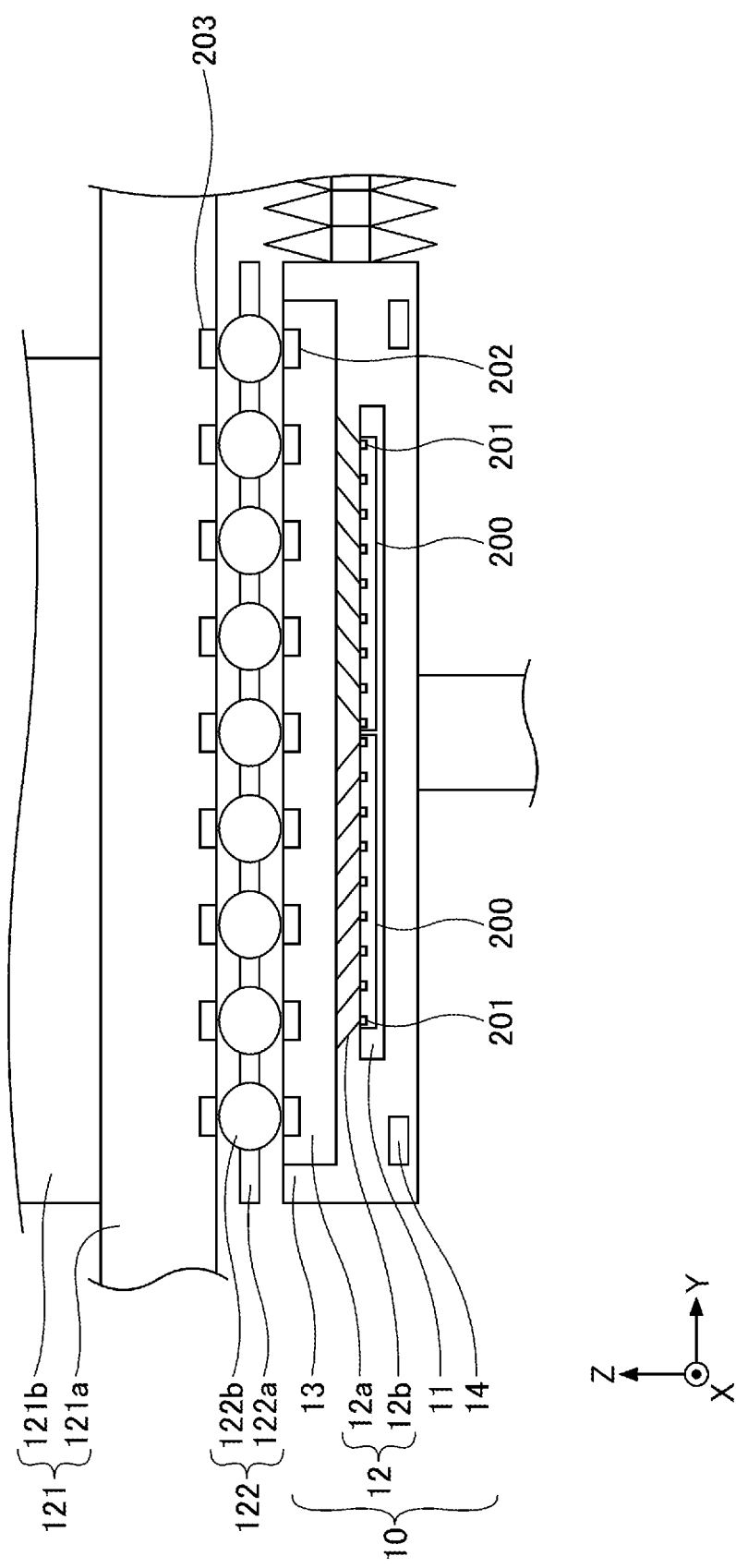
FIG. 8 is an enlarged cross-sectional view illustrating a portion of the configuration of the inspection unit according to the first embodiment.

The shell 10 is a structure including a wafer 11, a probe card 12, a housing 13, and a heat exchange medium passage 14. As illustrated in detail in FIG. 8, multiple DUTs 200 are formed on the surface of the wafer 11. The probe card 12 includes a base 12a and multiple probes 12b. The base 12a is a plate-like member having multiple terminals 202 on the upper surface of the base 12a. The multiple probes 12b are provided on the lower surface of the base 12a, and are configured to contact the DUTs 200 formed on the wafer 11. The housing 13 accommodates the wafer 11 and the probe card 12. The heat exchange medium passage 14 is formed in the housing 13, and a heat exchange medium is supplied to the heat exchange medium passage 14, from a temperature control device 123, which will be described below. The temperature of the wafer 11 accommodated in the housing 13 is adjusted by supplying the heat exchange medium to the heat exchange medium passage 14.

Each of the inspection devices 120 includes a tester 121, an intermediate connecting member 122, the temperature control device 123, and a housing 124. In each of the inspection devices 120, the tester 121 inspects electrical characteristics of multiple DUTs formed on a wafer 11 via the probe card 12.

The tester 121 includes a tester motherboard 121a and multiple test circuit boards 121b. The tester motherboard 121a is provided horizontally, and multiple terminals 203 are provided at the bottom. The multiple inspection circuit boards 121b are attached to respective slots in the tester motherboard 121a in an upright position.

The intermediate connecting member 122 is a member for electrically connecting the tester 121 with the probe card 12. The intermediate connecting member 122 includes a retainer 122a and multiple connection parts 122b.

The retainer 122a holds the multiple connection parts 122b on respective predetermined locations. The predetermined locations correspond to the respective terminals formed on the upper surface of the base 12a of the probe card 12. The retainer 122a is a plate-like member or a sheet-like member that is formed of an insulating material. Examples of the insulating material may include silicone rubber or silicone foam.

Each of the connection parts 122b is held by the retainer 122a at a location corresponding to a corresponding terminal of the multiple terminals 202 formed on the upper surface of the base 12a of the probe card 12. Thus, each of the multiple connection parts 122b electrically connects one of the multiple terminals 202 formed on the upper surface of the base 12a of the probe card 12, with a corresponding one of the multiple terminals 203 formed on the bottom surface of the tester motherboard 121a. Each of the connection parts 122b is formed of an elastic member to which an electrically conductive property is given on at least the surface.

A sealing member (not illustrated) is provided between the retainer 122a of the intermediate connecting member 122 and the tester motherboard 121a. As the space between the intermediate connecting member 122 and the tester motherboard 121a is evacuated, the intermediate connecting member 122 is drawn onto and secured to the tester motherboard 121a via the sealing member.

Thus, the intermediate connecting member 122 is secured to the tester motherboard 121a while each of the multiple connection parts 122b is electrically connected to the corresponding one of the terminals provided at the bottom of the tester motherboard 121a.

Figure 3A:
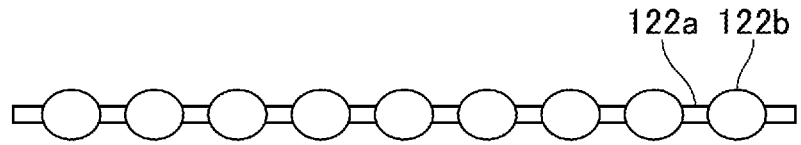
FIGS. 3A and 3B are diagrams illustrating an example of an intermediate connecting member.
Figure 3B:
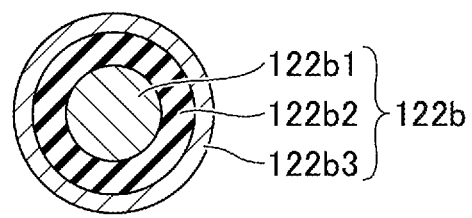

FIGS. 3A and 3B are diagrams illustrating an example of the intermediate connecting member. FIG. 3A is a side view of the intermediate connecting member, and FIG. 3B is a cross-sectional view of the connection part of the intermediate connecting member. As illustrated in FIG. 3A, the intermediate connecting member 122 includes the retainer 122a and the multiple connection parts 122b. Each of the connection parts 122b may be of spherical shape, for example. The size of each of the connection parts 122b may be approximately 0.05 mm to 0.5 mm, for example, and a distance between adjacent connection parts 122b may be approximately 0.5 mm to 1 mm, for example. Each of the connection parts 122b has a three-layer structure with a magnetic core 122b1, an elastic layer 122b2, and a conductive layer 122b3, as illustrated in FIG. 3B.

The magnetic core 122b1 is formed of a ferromagnetic material or a feeble magnetic material, and is shaped spherically. For example, nickel (Ni) may be used as a material of the magnetic core 122b1. The magnetic core 122b1 may be made by, for example, polishing, high compression, or injection molding.

The elastic layer 122b2 is formed of an elastic material, and covers the magnetic core 122b1. For example, silicone rubber or silicone foam may be used as the elastic layer 122b2. The elastic layer 122b2 is made by, for example, injection molding or electrodeposition.

The conductive layer 122b3 is formed of a conductive material, and covers the elastic layer 122b2. The conductive layer 122b3 is preferably made of a material having high electrical contacting property. For example, rare metal such as gold (Au), palladium (Pd), rhodium (Rh), or tungsten (W) may be used. The conductive layer 122b3 is made by, for example, plating or evaporation.

The example of FIG. 3B illustrates a case in which each of the connection parts 122b has a three-layer structure. However, each of the connection parts 122b may be formed of an elastic member to which an electrically conductive property is given at least on the surface, and each of the connection parts 122b may be a dual-layer structure with the elastic layer 122b2 and the conductive layer 122b3. However, it is preferable that each of the connection parts 122b includes the magnetic core 122b1. As each of the connection parts 122b has the magnetic core 122b1, precise positioning of each of the connection parts 122b can be performed by using magnetic force, when fabricating the intermediate connecting member 122.

In addition, for each of the connection parts 122b, an elastic magnetic layer formed of an elastic material containing magnetic particles may be used, instead of the magnetic core 122b1 and the elastic layer 122b2. Further, for each of the connection parts 122b, an elastic conductive layer formed of an elastic material containing conductive particles may be used, instead of the elastic layer 122b2 and the conductive layer 122b3. Alternatively, for each of the connection parts 122b, a single-layer structure formed of an elastic material containing conductive magnetic particles may be used, instead of the magnetic core 122b1, the elastic layer 122b2, and the conductive layer 122b3.

Figure 4:
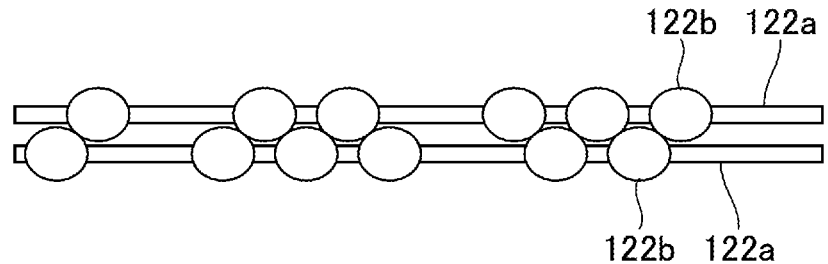
FIG. 4 is a diagram illustrating another example of the intermediate connecting member.

FIG. 4 is a diagram illustrating another example of the intermediate connecting member, which is a side view of the intermediate connecting member. As illustrated in FIG. 4, an intermediate connecting member 122A has a two-layer structure, and each layer includes a retainer 122a and multiple connection parts 122b. The retainer 122a and the connection parts 122b in each of the layers have similar structures to the above-described example illustrated in FIGS. 3A and 3B. According to the intermediate connecting member 122A illustrated in FIG. 4, because the intermediate connecting member 122A is formed by stacking two layers each of which includes the retainer 122a and the multiple connection parts 122b, a stroke of elastic deformation in a stacking direction can be extended.

In the example of FIG. 4, the intermediate connecting member 122A having a two-layer structure is described. However, the number of layers in the intermediate connecting member 122A may be three or more. This further extends the stroke of the elastic deformation in the stacking direction.

Figure 5:
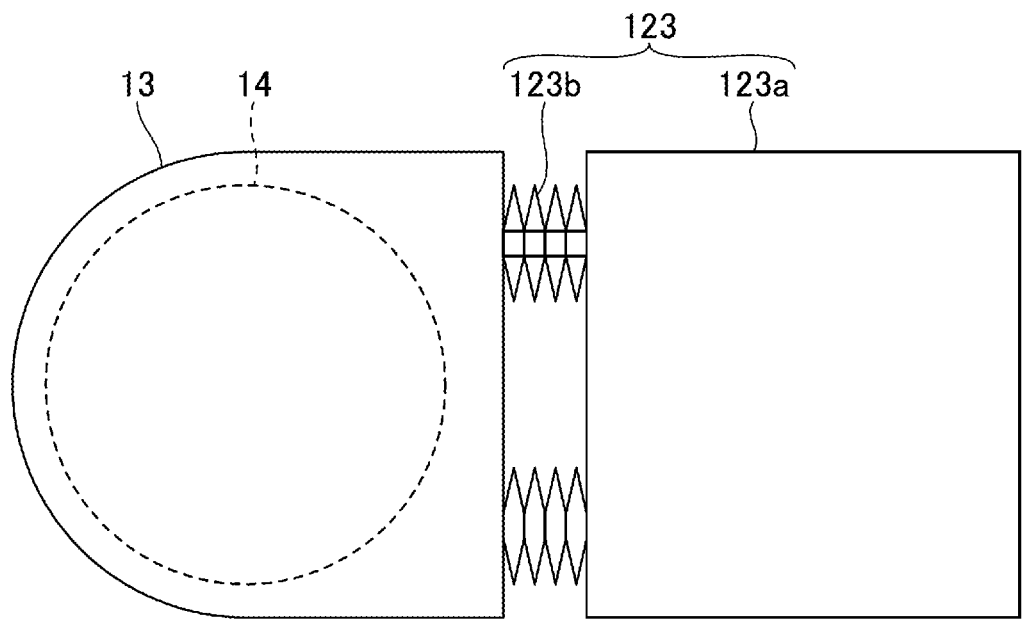
FIG. 5 is an explanatory view of a temperature control device of the inspection device.

FIG. 5 is an explanatory view of the temperature control device 123 of the inspection device 120. As illustrated in FIG. 5, the temperature control device 123 includes a heat exchange medium supply 123a and a heat exchange medium supply line 123b.

The heat exchange medium supply 123a supplies a heat exchange medium to the heat exchange medium passage 14 of the shell 10 via the heat exchange medium supply line 123b, and circulates the heat exchange medium in the heat exchange medium passage 14. The heat exchange medium supply 123a can switch a heat exchange medium to be supplied to the heat exchange medium passage 14 between, for example, at least two types of heat exchange media. The heat exchange media may be high-temperature fluid and low-temperature fluid. The type of the high-temperature fluid is not particularly limited as long as temperature of the high-temperature fluid is higher than room temperature. For example, hot water or brine can be used as the high-temperature fluid. The type of the low-temperature fluid is not particularly limited as long as temperature of the low-temperature fluid is lower than room temperature. For example, cold water or brine can be used as the low-temperature fluid. In a case in which a temperature of a wafer 11 is adjusted to temperature higher than room temperature, the heat exchange medium supply 123a supplies high-temperature fluid through the heat exchange medium supply line 123b to the heat exchange medium passage 14 of the shell 10. In contrast, in a case in which a temperature of a wafer 11 is adjusted to temperature lower than room temperature, the heat exchange medium supply 123a supplies low-temperature fluid through the heat exchange medium supply line 123b to the heat exchange medium passage 14 of the shell 10.

The heat exchange medium supply line 123b connects the heat exchange medium supply 123a with the heat exchange medium passage 14 of the shell 10. The heat exchange medium supply line 123b supplies a heat exchange medium from the heat exchange medium supply 123a to the heat exchange medium passage 14 of the shell 10, and returns the heat exchange medium from the heat exchange medium passage 14 of the shell 10 to the heat exchange medium supply 123a. The heat exchange medium supply line 123b is formed to be detachable from the heat exchange medium passage 14.

According to the temperature control device 123, by the heat exchange medium supply 123a providing a heat exchange medium to the heat exchange medium passage 14 of the shell 10 through the heat exchange medium supply line 123b, and by circulating the heat exchange medium in the heat exchange medium passage 14, a temperature of the shell 10 is adjusted.

Referring back to FIG. 2, the housing 124 accommodates the tester 121, the intermediate connecting member 122, and the temperature control device 123. The housing 124 also accommodates the shell 10 that is loaded into the housing 124 by the transfer device 130.

Figure 6:
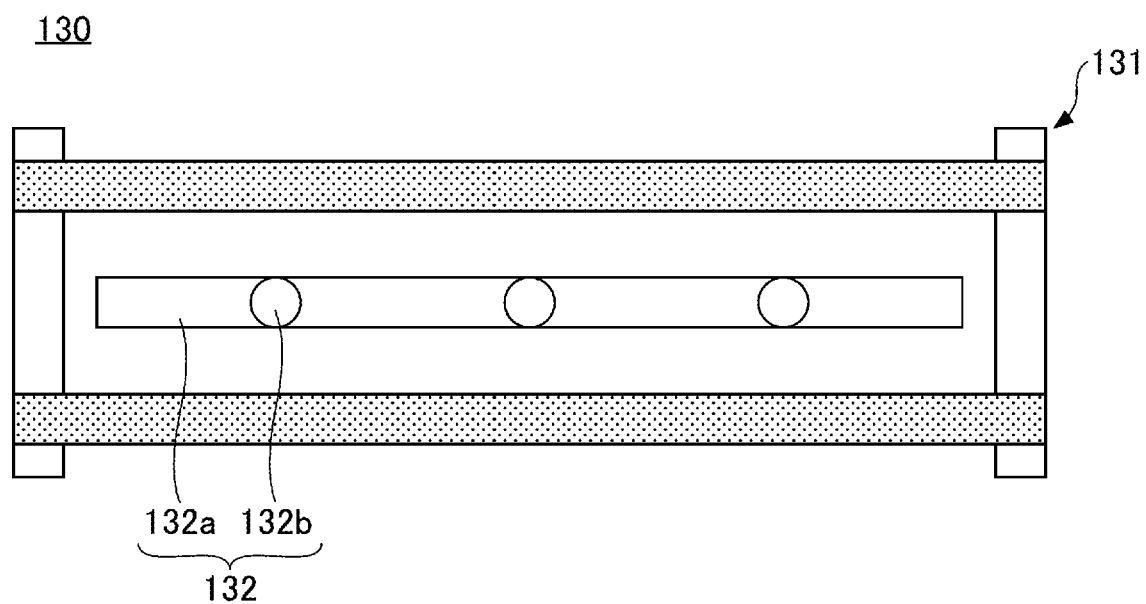
FIG. 6 is a top view of a transfer device.

The transfer device 130 conveys the shell 10 loaded into the inspection chamber 110 to each of the inspection devices 120. FIG. 6 is a top view of the transfer device 130. As illustrated in FIG. 6, the transfer device 130 includes a belt conveyor 131 and a lifting mechanism 132.

The belt conveyor 131 is driven by a motor (not illustrated) to convey the shell 10 loaded into the inspection chamber 110 to the bottom of each of the inspection devices 120.

The lifting mechanism 132 includes a support 132a and lift units 132b. The support 132a is formed of a plate-like member extending along the direction of travel of the belt conveyor 131, to support the lift units 132b.

The lift units 132b are provided below each of the respective inspection devices 120. Each of the lift units 132b extends to lift the shell 10 conveyed on the belt conveyor 131. This allows the multiple terminals formed on the upper surface of the base 12a of the probe card 12 and the multiple terminals formed on the bottom surface of the tester motherboard 121a to be electrically connected via the intermediate connecting member 122. At this time, positioning pins (not illustrated) provided on the bottom surface of the tester motherboard 121a are fitted into positioning holes (not illustrated) formed on the upper surface of the probe card 12. Accordingly, the multiple terminals formed on the top surface of the base 12a of the probe card 12 are positioned to the multiple connection parts 122b of the intermediate connecting member 122. However, a mechanism for positioning the multiple terminals to the multiple connection parts 122b is not limited to the above-described mechanism using positioning pins and positioning holes, and various positioning mechanisms can be utilized. For example, the lift unit 132b may be configured to be rotatable, and the multiple terminals may be positioned to the multiple connection parts 122b by the lift unit 132b rotating the shell 10.

The shell 10 may also be secured to the tester motherboard 121a by a fastener (not illustrated) in a state in which the shell 10 is positioned to the tester 121. Alternatively, instead of the fastener, a sealing member (not illustrated) may be provided between the retainer 122a of the intermediate connecting member 122 and the probe card 12. In this case, by evacuating a space between the intermediate connecting member 122 and the probe card 12, the probe card 12 is sucked and secured to the intermediate connecting member 122 via the sealing member.

Next, an example of an inspection method using the inspection unit 100 according to the first embodiment will be described with reference to FIGS. 1 and 2.

First, when the shell 10 is transported onto the belt conveyor 131 of the transfer device 130, the belt conveyor 131 is operated to convey the shell 10 to a location below one of the inspection devices 120.

Subsequently, by extending the lift unit 132b to lift the shell 10 while the shell 10 is supported, the multiple terminals formed on the upper surface of the base 12a of the probe card 12 are electrically connected with the multiple connection parts 122b of the intermediate connecting member 122. At this time, the multiple terminals are positioned to the multiple connection parts 122b by the positioning pins on the bottom of the tester motherboard 121a being fitted into the positioning holes formed on the top surface of the probe card 12. Further, the temperature of the wafer 11 is adjusted to a temperature for inspection, by connecting the heat exchange medium passage 14 of the shell 10 with the heat exchange medium supply line 123b of the temperature control device 123, and by supplying heat exchange medium to the heat exchange medium passage 14, from the heat exchange medium supply 123a through the heat exchange medium supply line 123b.

Next, the electrical characteristics of the multiple DUTs formed on the wafer 11 are inspected by the tester 121, by applying electrical signals to the DUTs through the intermediate connecting member 122 and the probe card 12.

As described above, in the first embodiment, the wafer 11 and the probe card 12 are integrally loaded into the inspection unit 100 in a state in which the probes 12b of the probe card 12 are electrically contacted with the electrodes 201 of the multiple DUTs 200 formed on the wafer 11. The inspection unit 100 electrically connects the multiple terminals 202 formed on the top surface of the probe card 12 with multiple terminals 203 formed on the bottom portion of the tester motherboard 121a through the connection parts 122b of the intermediate connecting member 122, and inspects the multiple DUTs 200. This simplifies the interface of the inspection unit 100. Also, the inspection unit 100 does not require positioning of the wafer 11 to the probe card 12. Therefore, the structure of the inspection unit 100 is simplified because there is no need to provide an aligner in the inspection unit 100. Although the inspection unit 100 positions the probe card 12 with respect to the tester 121, the positioning is not required to be more accurate than positioning of the wafer 11 to the probe card 12. Thus, positioning can be performed using, for example, positioning pins. As an example of a requirement specification with respect to accuracy of positioning, an order of μm is required for positioning of the wafer 11 to the probe card 12, while an order of mm is required for positioning of the probe card 12 to the tester 121.

Second Embodiment

An inspection unit according to a second embodiment will be described. The inspection unit according to the second embodiment differs from the inspection unit of the first embodiment in that the shell 10 and the intermediate connecting member 122 are loaded into the inspection device 120 in an integrated state. Because the other points are the same as those in the first embodiment, differences between the second embodiment and the first embodiment will be mainly described below.

Figure 7:
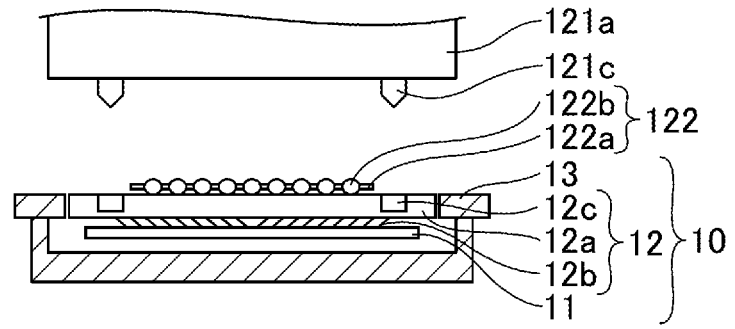
FIG. 7 is a cross-sectional view illustrating an example of the configuration of an inspection unit according to a second embodiment.

FIG. 7 is a cross-sectional view illustrating an example of a configuration of the inspection unit according to the second embodiment, which illustrates an intermediate connecting member 122 and a shell 10 that are part of an inspection apparatus in the inspection unit.

As illustrated in FIG. 7, in the inspection unit 100A according to the second embodiment, the probe card 12 and the intermediate connecting member 122 are transported below the inspection device 120, while the multiple terminals formed on the upper surface of the probe card 12 are electrically connected to the multiple connection parts 122b of the intermediate connecting member 122. Subsequently, positioning pins 121c formed on the bottom of the tester motherboard 121a are fitted into positioning holes 12c formed on the upper surface of the probe card 12. Accordingly, the multiple connection parts 122b of the intermediate connecting member 122 are positioned and electrically connected to the multiple terminals formed at the lower surface of the tester motherboard 121a.

As described above, in the second embodiment, the shell 10 including the wafer 11 and the probe card 12, and the intermediate connecting member 122 are integrally loaded into the inspection unit 100A. Then, in the inspection unit 100A, multiple terminals formed on the upper surface of the probe card 12 and the multiple terminals formed on the bottom surface of the tester motherboard 121a are electrically connected to each other via the connection parts 122b of the intermediate connecting member 122, to inspect the multiple DUTs. This simplifies the interface of the inspection unit 100A. Also, the inspection unit 100A does not require positioning of the wafer 11 to the probe card 12. Therefore, the structure of the inspection unit 100A is simplified because there is no need to provide an aligner in the inspection unit 100A. Although the inspection unit 100A positions the probe card 12 with respect to the tester 121, the positioning is not required to be more accurate than positioning of the wafer 11 to the probe card 12. Thus, positioning can be performed using, for example, the positioning pins. As an example of a requirement specification with respect to accuracy of positioning, an order of μm is required for positioning of the wafer 11 to the probe card 12, while an order of mm is required for positioning of the probe card 12 to the tester 121.

In the above-described embodiment, the tester motherboard 121a is an example of a first member, and the terminals of the tester motherboard 121a are an example of first terminals. The probe card 12 is an example of a second member, and the terminals of the base 12a are an example of second terminals. For example, an equivalent of the probe card 12 may be an intermediate connecting member of the present invention. In this case, an intermediate member other than the intermediate connecting member 122, or the tester motherboard 121a corresponds to the first member, and the wafer 11 corresponds to the second member.

The embodiments disclosed herein should be exemplary in all respects and not limiting. The above embodiments may include omissions, substitutions, or modifications in various forms without departing from the appended claims and spirit thereof.

What is claimed is:

1. An inspection apparatus comprising:
a tester configured to apply electrical signals to a plurality of devices formed on a substrate to inspect electrical characteristics of the plurality of devices;
a probe card including probes configured to contact electrodes of the plurality of devices;
an intermediate connecting member including a plurality of connection parts and a retainer that holds the plurality of connection parts, the plurality of connection parts being configured to electrically connect respective terminals of the tester to respective terminals of the probe card; and
a mechanism configured to
allow the probe card to be loaded together with the substrate, as one unit, to the inspection apparatus while the probes of the probe card are being in contact with the electrodes of the plurality of devices,
cause the terminals of the probe card formed on a top surface thereof to be brought in contact with the terminals of the tester formed on a bottom portion of a tester motherboard thereof through the connection parts of the intermediate connecting member, and
cause the plurality of devices to be inspected.

2. The inspection apparatus as claimed in claim 1, wherein the mechanism is configured to allow the probe card to be loaded to the inspection apparatus while the terminals of the probe card formed on the top surface thereof are being in electrical contact with the connection parts of the intermediate connecting member.

3. The inspection apparatus as claimed in claim 1, wherein the mechanism includes:
a belt conveyor configured to convey the probe card and the substrate to a location under the tester while the probes of the probe card are being in contact with the electrodes of the plurality of devices; and
a lift unit configured to lift up and down the probe card and the substrate, and
wherein the lift unit is extended to lift up the probe card and the substrate.

4. The inspection apparatus as claimed in claim 2, wherein the mechanism includes:
a belt conveyor configured to convey the probe card and the substrate to a location under the tester while the probes of the probe card are being in contact with the electrodes of the plurality of devices; and
a lift unit configured to lift up and down the probe card and the substrate, and
wherein the lift unit is extended to lift up the probe card and the substrate.

* * * * *